(12) United States Patent
Jacobs et al.

(10) Patent No.: US 10,667,409 B2
(45) Date of Patent: May 26, 2020

(54) CONTACTING ARRANGEMENT AND METHOD FOR FORMING THE CONTACTING ARRANGEMENT

(71) Applicant: Robert Bosch GmbH, Stuttgart (DE)

(72) Inventors: Heiner Jacobs, Baden-Baden (DE);
Martin Rittner, Ludwigsburg (DE);
Ulrich Kessler, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/242,692

(22) Filed: Jan. 8, 2019

(65) Prior Publication Data

US 2019/0215969 A1 Jul. 11, 2019

(30) Foreign Application Priority Data

Jan. 11, 2018 (DE) .................. 10 2018 200 332

(51) Int. Cl.
| | | |
|---|---|---|
| *H05K 3/30* | (2006.01) | |
| *H01G 4/228* | (2006.01) | |
| *H01R 12/58* | (2011.01) | |
| *H05K 1/18* | (2006.01) | |

(52) U.S. Cl.
CPC ............ *H05K 3/308* (2013.01); *H01G 4/228* (2013.01); *H01R 12/58* (2013.01); *H05K 1/182* (2013.01); *H05K 2201/10015* (2013.01); *H05K 2201/1059* (2013.01); *H05K 2201/10651* (2013.01); *H05K 2203/0285* (2013.01); *H05K 2203/1189* (2013.01)

(58) Field of Classification Search
CPC ........ H01G 4/228; H05K 3/308; H05K 1/182; H05K 2201/10651; H05K 2201/1059; H05K 2201/10015; H05K 2203/1189; H01R 12/58
See application file for complete search history.

(56) References Cited

U.S. PATENT DOCUMENTS

| | | | |
|---|---|---|---|
| 2007/0099448 A1* | 5/2007 | Taylor | H05K 1/141 439/73 |
| 2009/0147440 A1* | 6/2009 | Cygan | H01G 4/232 361/306.3 |
| 2015/0355031 A1* | 12/2015 | Matsumoto | G01J 5/0896 219/121.66 |
| 2019/0115161 A1* | 4/2019 | Will | H01G 9/008 |

FOREIGN PATENT DOCUMENTS

DE 102008050452 B4 9/2010

* cited by examiner

*Primary Examiner* — Hoa C Nguyen
(74) *Attorney, Agent, or Firm* — Norton Rose Fulbright US LLP; Gerard Messina

(57) ABSTRACT

A contacting arrangement between an electrical component and a circuit carrier, the component being connected to a connection element formed as a part separate from the component, and the connection element being electroconductively contacted directly with the circuit carrier via at least one press-fit connection.

1 Claim, 2 Drawing Sheets

CONTACTING ARRANGEMENT AND METHOD FOR FORMING THE CONTACTING ARRANGEMENT

CROSS REFERENCE

The present application claims the benefit under 35 U.S.C. § 119 of German Patent Application No. DE 10 2018 200 332.7 filed on Jan. 11, 2018, which is expressly incorporated herein by reference in its entirety.

FIELD

The present invention relates to a contacting arrangement between an electrical component and a circuit carrier. The present invention further relates to a method for forming such a contacting arrangement.

BACKGROUND INFORMATION

A contacting arrangement is described in German Patent Application No. DE 10 2008 050 452 B4. In this contacting arrangement, a capacitor is connected to a circuit carrier. In this arrangement, it is provided that connecting plates are situated on contact surfaces of the capacitor or are soldered to the contact surfaces which, in turn, are connected to conductor bars situated on, and connected to, the circuit carrier. The connection between the connecting plates on the capacitor and the conductor bars is made, on the one hand, via a flat abutting contact of the aforementioned elements, and on the other hand, via tooth-like projections on the connecting plates, which engage in diametrically opposed recesses of the conductor bars in a form-fit manner. A main feature in this case is that the connection between the conductor bars and the circuit carrier is also made via an integral connection or via a soldered connection. It is also provided in this contacting arrangement that an additional screw connection is made between the conductor bars and the connecting plates, for which purpose the conductor bars and the connecting plates include through-openings overlapping one another, which are designed for guiding through screw elements or the like.

The above-described contacting arrangement therefore requires two connection elements between the capacitor and the circuit carrier in the area of the two terminals of the capacitor, the connecting plate and the conductor bar. It must also be considered that in circuit carriers, which include heat-sensitive components, in particular, in direct proximity to the contacting arrangement described thus far, soldering or connecting the conductor bar to the circuit carrier means thermally stressing the components mentioned, so that it is necessary, in particular, to mount the corresponding components on the circuit carrier only after connecting the conductor bars to the circuit carrier. This results in a relatively complex handling, since the circuit carrier must be manipulated together with the conductor bars in order to solder the components. This also results in a particular manufacturing sequence, which is potentially disadvantageous for reasons of layout of the circuit carrier.

SUMMARY

The contacting arrangement according to the present invention between an electrical component and a circuit carrier may have the advantage that this arrangement manages without an integral connection between the connection element and the circuit carrier, and therefore avoids thermally stressing the components situated near the contacting arrangement on the circuit carrier. In addition, the contacting arrangement according to the present invention makes it possible to dispense with soldered connections or welded connections between the connection element and the circuit carrier, so that a particularly simple and cost-efficient assembly is possible by the press-fit connection provided according to the present invention.

Advantageous refinements of the contacting arrangement according to the present invention between an electrical component and a circuit carrier are described herein.

A structural design of the contacting arrangement is particularly preferred, in which the press-fit connection also forms the mechanical connection between the circuit carrier and the component, and the press-fit connection also being the only mechanical connection between the component and the circuit carrier. As a result, it is possible,—in contrast to the related art described above—to dispense with additional connection means or fastening elements, such as screws or the like.

In order to enable a minimal electrical transfer resistance between the component and the connection element, it is preferably provided that the connection between the component and the connection element is formed as an integral connection, in particular, as a soldered connection. Contemplated in this regard are, in particular, large components, for example, ceramic capacitors, which have large-area contacting surfaces for forming the connection to the connection element.

Another, structurally particularly preferred design of the contacting arrangement in accordance with the present invention provides that the connection element is designed as a connecting plate, that the connecting plate includes a contact surface on the side facing the component, which is designed as a constituent of an upper side and lower side of the connecting plate, that the connecting plate includes tooth-like projections formed as press-fit contacts, which are formed on a front face of the connecting plate, and that the plane of the contact surface and the plane of the projections are situated in parallel and spaced apart from one another. The last-mentioned feature of the parallel and spaced-apart arrangement of the plane of the contact surfaces and projections, in particular, makes a mechanically particularly advantageous connection between the electrical component and the circuit carrier possible, in which the lateral forces acting on the electrical component are particularly efficiently transferred to the circuit carrier and, in addition, an increased lateral spacing between the press-fit openings and the component is made possible, which facilitates the handling when joining the connection element to the circuit carrier.

The component, as already explained above, is, in particular, a capacitor, opposite sides of the capacitor being connected to one connection element each. It is further preferably provided that a front surface of the capacitor rests on the circuit carrier between the connection elements. The resting of the component on the circuit carrier allows the press-fit depth of the projections on the connection element, for example, to be adjusted and, in addition, for example, a heat conducting contact to be particularly simply established, if necessary, between the component and the circuit carrier for the purpose of heat dissipation.

The present invention also includes a method for forming a contacting arrangement, in particular, a contacting arrangement according to the present invention as described thus far, the method including at least the following steps:

integral connection between the connection element and the component, forming a press-fit connection between the connection element and at least one opening in the circuit carrier.

A particularly preferred variant of the method for forming the contacting arrangement provides that the forming of the press-fit connection is assisted with the aid of ultrasonic oscillations. This may, in practice, reduce the required press-fit forces, in particular, by up to 70% and it enables a greater tolerance with respect to the dimensioning and/or arrangement of the press-fit openings in the circuit carrier and of the projections on the connection element.

With respect to the oscillation direction of the ultrasonic oscillations, these oscillations are oriented preferably perpendicular to the joining direction of the component.

Additional advantages, features and details of the present invention result from the following description of preferred exemplary embodiments and with reference to the figures.

DETAILED DESCRIPTION OF EXAMPLE EMBODIMENTS

Figure 1:
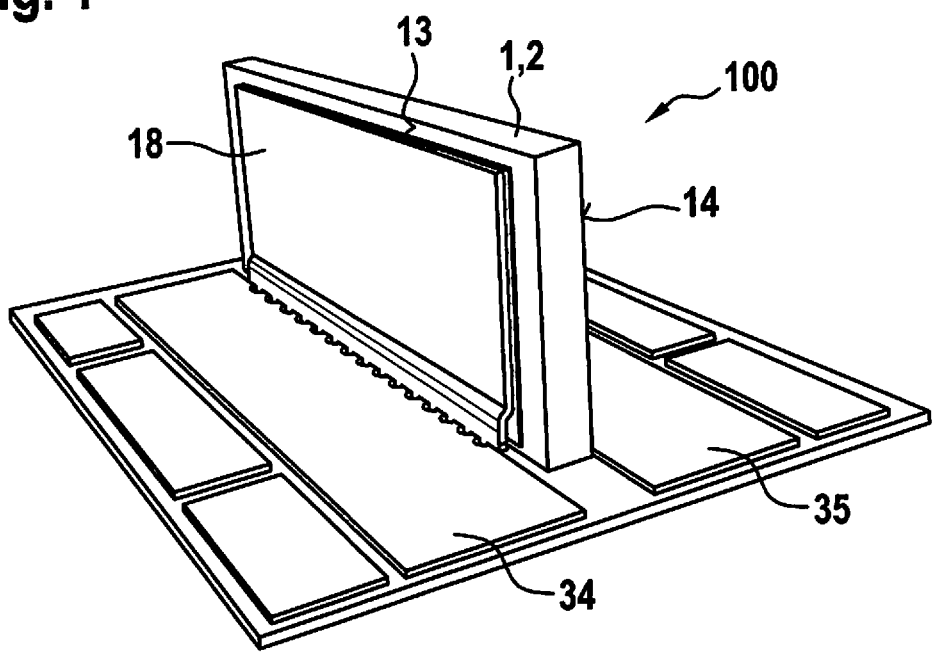
FIG. 1 shows a perspective view of a capacitor connected to a circuit carrier.

Identical elements or elements having an identical function are provided with the same reference numerals in the figures.

Figure 2:
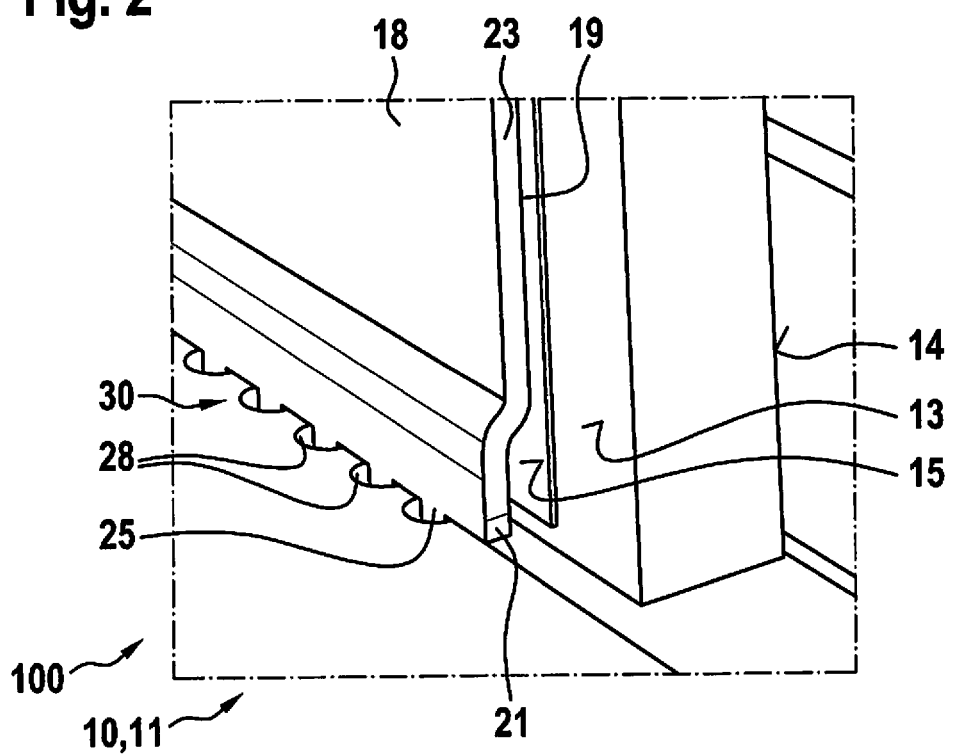
FIG. 2 shows a detail of FIG. 1 in the area of a press-fit connection in an enlarged depiction, also in a perspective view.
Figure 3:
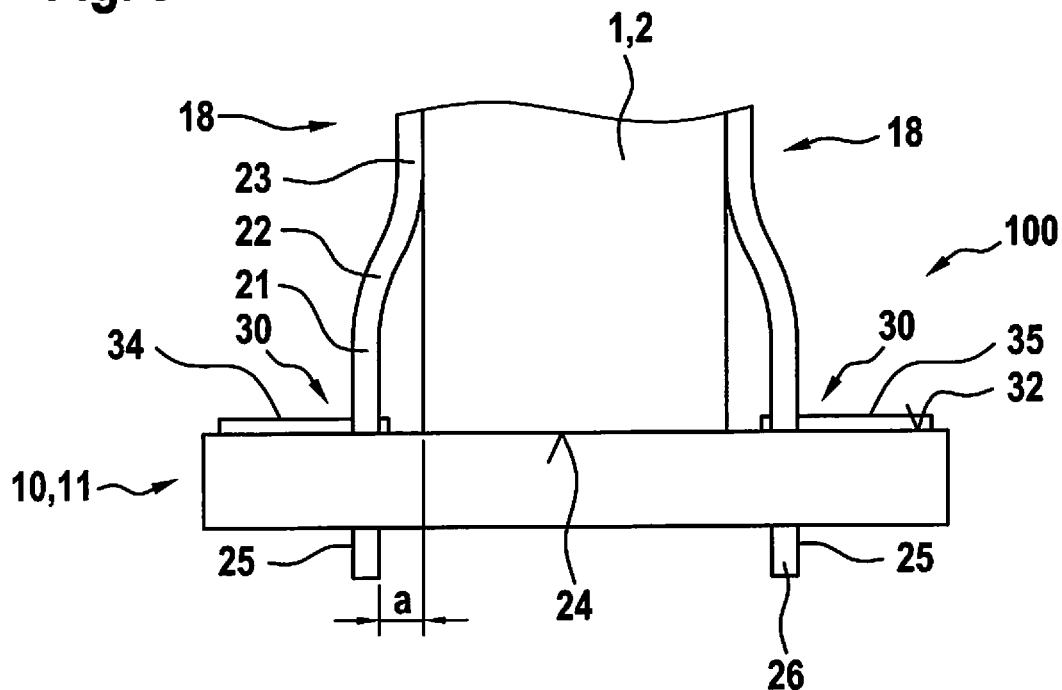
FIG. 3 shows the arrangement according to FIG. 1 in a side view.

A contacting arrangement 100 between an electrical component 1 in the form of a plate shaped (ceramic) capacitor 2 and a circuit carrier 10 in the form of a circuit board 11, a substrate or the like is depicted in the FIGS. 1 through 3. Electrical component 1 or capacitor 2 is block-shaped, the two opposite (large) side surfaces 13, 14 of component 1 serving as contacts, and a contact surface 15 formed from an electrically conductive material being provided in the area of side surfaces 13, 14, as is apparent based on side surface 13 in FIG. 2. This contact surface 15 is connected at least in areas with an essentially flat, electrically conductive connection element 18 made of sheet metal via an integral connection 19, connection 19 being formed on the upper side and lower side of connection element 18, which acts as an electrically conductive contact surface.

Integral connection 19, which may be formed as a flat connection, may, in particular, be a welded connection, a soft-soldered connection, a sintered connection or a hard-soldered connection.

A main feature here is that integral connection 19 between electrical component 1 and connection element 18 in the exemplary embodiment described has also been produced in advance or separately prior to the formation of contacting arrangement 100. In the exemplary embodiment depicted, both connection element 18, as well as side surfaces 13, 14, and contact surfaces 15 of capacitor 2 each have a rectangular shape, connection element 18 having a smaller surface area, for example, than corresponding side surfaces 13, 14, and contact surfaces 15.

As is shown, based on a synopsis of FIGS. 1 through 3, the connection element 18 includes a connection section 21 on the side facing circuit carrier 10, which is connected via an S-shaped intermediate section 22 to a section 23 that forms contact surface 15, in which integral connection 19 is formed. Connection section 21 situated in parallel to section 23 also exhibits a distance a from the plane of section 23 (FIG. 3).

Connection section 21 also protrudes beyond front face 24 of electrical component 1 or of capacitor 2 facing circuit carrier 10. Connection section 21 includes a plurality of press-fit contacts 25 in the form of projections formed, in particular, by a punch process situated in parallel to one another, which include pointed or conically-shaped end areas 26 on the side facing circuit carrier 10. Press-fit contacts 25 interact with press-fit openings 28 formed in circuit carrier 10. A main feature here is that when fitting press-fit contacts 25 into press-fit openings 28, press-fit connections 30 are formed in each case which enable an electrical contacting between electrical component 1 and circuit carrier 10. For this purpose, it may be provided in a conventional manner that press-fit openings 30 are electrically conductive, for example, with the aid of corresponding coatings or through-contacts in the form of vias.

As is also shown in FIG. 3, front face 24 of electrical component 1 rests flat on upper side 32 of circuit carrier 10. As is also shown in FIG. 3, electrically conductive areas 34, 35 are provided in the area of upper side 32 of circuit carrier 10, via which electrical component 1 is electrically contacted with press-fit contacts 25.

Figure 4:
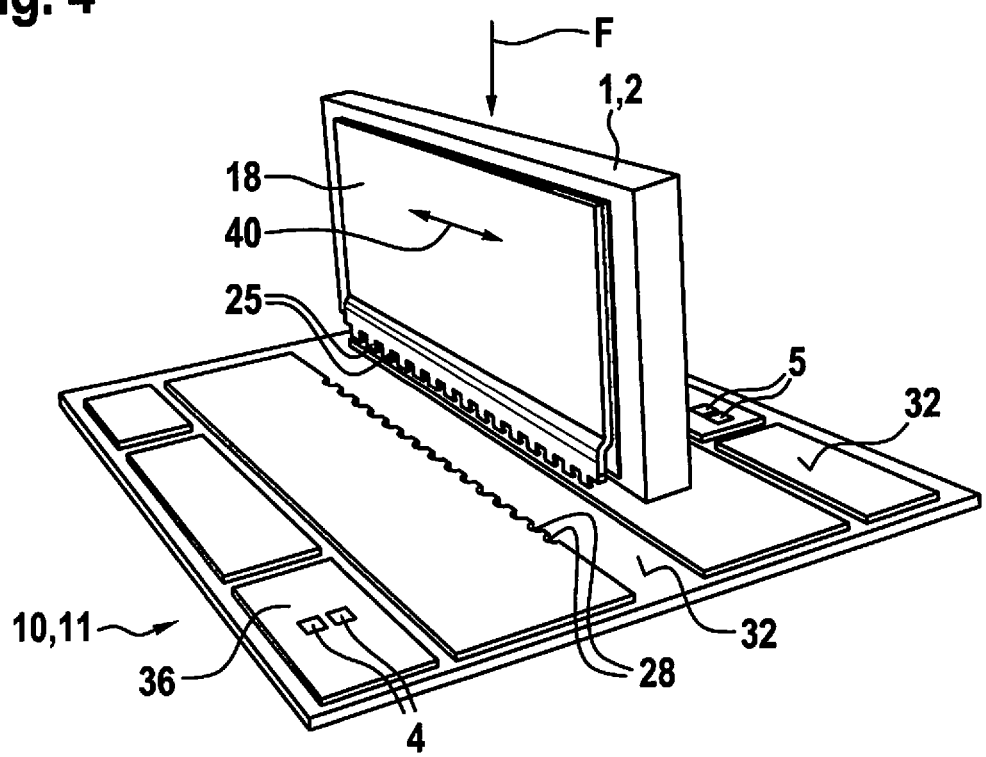
FIG. 4 shows the circuit carrier and the capacitor according to FIG. 1 in a perspective view for illustrating the joining process of the capacitor in the area of the circuit carrier.

In addition, it is depicted solely in FIG. 4, for example, that additional components 4, 5 may be situated relatively close to electrical component 1, or capacitor 2, on other electrically conductive areas 36, 37 on upper side 32 of circuit carrier 10. These components 4, 5 may be designed, for example, in the form of SMD parts or the like and, if necessary, may be thermally stressable only up to a relatively low temperature.

The joining process or the connection of electrical component 1 to circuit carrier 10 is shown in a simplified manner in FIG. 4. It is apparent here that electrical component 1 is moved in the direction of circuit carrier 10 with the aid of a joining force F extending perpendicular to the surface of circuit carrier 10, press-fit contacts 25 of connection element 18 being aligned with press-fit openings 32 in circuit carrier 10. Thus, the press-fit connections 30 are formed via a correspondingly high joining force F. In addition, it may be provided for facilitating the joining process that ultrasonic oscillations are introduced into component 1 in the direction of double arrow 40 extending, in particular, in a direction perpendicular to joining force F or in parallel to the surface of circuit carrier 10, in order to facilitate the joining process.

It is also mentioned that the direction of the ultrasonic oscillations introduced into component 1 may alternatively also extend in parallel to the surface of circuit carrier 10, in order to facilitate the joining process.

Contacting arrangement 100 described thus far may be adapted or modified in a variety of ways, without departing from the inventive concept. This concept involves connecting electrical component 1 to a circuit carrier 10 exclusively via one connection element 18 and with the aid of press-fit connections 30. The present invention is, in particular, not intended to be limited to capacitors 2 as electrical components 1. Thus, it may be provided, for example, to first establish press-fit connections 30 between connection element 18 and circuit carrier 10, and only subsequently establish the connection between connection element 18 and component 1.

What is claimed is:

1. A method for forming a contacting arrangement between an electrical component and a circuit carrier, the contacting arrangement including a connection element, the component being connected to the connection element, the connection element being formed as a part separate from the component, wherein the connection element is electroconductively contacted directly with the circuit carrier via at least one press-fit connection, the method comprising:

integrally connecting the connection element to the component; and forming the press-fit connection between the connection element and at least one opening of the circuit carrier, wherein:

the formation of the press-fit connection is assisted with the aid of ultrasonic oscillations, and the oscillation direction of the ultrasonic oscillations extends perpendicular to a joining direction of the component.

\* \* \* \* \*